(12) United States Patent
Sridhar et al.

(10) Patent No.: US 12,203,774 B2
(45) Date of Patent: Jan. 21, 2025

(54) TRIM CIRCUIT AND METHOD OF OSCILLATOR DRIVE CIRCUIT PHASE CALIBRATION

(71) Applicant: NXP USA, INC., Austin, TX (US)

(72) Inventors: Raghavendra N Sridhar, Queen Creek, AZ (US); Gerhard Trauth, Muret (FR); Keith L. Kraver, Gilbert, AZ (US); Sung Jin Jo, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 325 days.

(21) Appl. No.: 17/654,057

(22) Filed: Mar. 8, 2022

(65) Prior Publication Data

US 2022/0326044 A1   Oct. 13, 2022

(30) Foreign Application Priority Data

Apr. 8, 2021   (EP) ..................................... 21305450

(51) Int. Cl.
*G01C 25/00*   (2006.01)
*B81B 7/02*    (2006.01)
*G01C 19/5726* (2012.01)
*G01C 19/5762* (2012.01)
*H04L 27/12*   (2006.01)

(52) U.S. Cl.
CPC ................ *G01C 25/00* (2013.01); *B81B 7/02* (2013.01); *G01C 19/5726* (2013.01); *G01C 19/5762* (2013.01); *H04L 27/125* (2013.01); *B81B 2201/0242* (2013.01)

(58) Field of Classification Search
None
See application file for complete search history.

(56) References Cited

U.S. PATENT DOCUMENTS 7,003,066 B1 *   2/2006   Davies .................. H03L 7/0814
                                                              375/376
2008/0013656 A1   1/2008   Van Sinderen et al.
2011/0254599 A1  10/2011   Dikshsit et al.
(Continued)

FOREIGN PATENT DOCUMENTS

JP   S60208115 A   10/1984
JP   60-208115 A   10/1985

*Primary Examiner* — Patrick Assouad
*Assistant Examiner* — Mark A Shabman
(74) *Attorney, Agent, or Firm* — Bruce M. Green; Charlene Jacobsen

(57) ABSTRACT

An oscillator drive circuit and a trim circuit are implemented inside an integrated circuit of a sensor. The drive circuit provides an oscillating drive signal at a resonant frequency to drive a movable mass of the sensor. The drive circuit includes a phase shift circuit having an input for receiving a first signal indicative of an oscillation of the movable mass and having an output. The phase shift circuit adds a phase shift component to the first signal and produces a second signal shifted in phase by the phase shift component. The trim circuit includes a first comparator for receiving the first signal, a second comparator for receiving the second signal, and a processing element. The processing element determines a phase lag between the first and second signals and produces trim code for use by the phase shift circuit, the trim code being configured to adjust the phase shift component.

14 Claims, 5 Drawing Sheets

(56) References Cited

U.S. PATENT DOCUMENTS

| | | | |
|---|---|---|---|
| 2012/0303688 A1* | 11/2012 | Kuo | H03J 1/0008 |
| | | | 708/1 |
| 2014/0118040 A1* | 5/2014 | Nakayama | H03L 7/0816 |
| | | | 327/157 |
| 2015/0280949 A1* | 10/2015 | Cornibert | H04L 27/04 |
| | | | 340/1.1 |
| 2016/0290804 A1* | 10/2016 | Cassagnes | G01C 19/5726 |

\* cited by examiner

TRIM CIRCUIT AND METHOD OF OSCILLATOR DRIVE CIRCUIT PHASE CALIBRATION

CROSS-REFERENCE TO RELATED APPLICATIONS

This application claims priority under 35 U.S.C. § 119 to European Patent Application No. 21305450.5, filed on Apr. 8, 2021, the contents of which are incorporated by reference herein.

TECHNICAL FIELD OF THE INVENTION

The present invention relates generally to inertial sensors. More specifically, the present invention relates to vibratory gyroscope devices and a trim circuit for phase calibration of an oscillator drive circuit of a vibratory gyroscope device.

BACKGROUND OF THE INVENTION

Vibratory microelectromechanical systems (MEMS) gyroscopes are used in a variety of systems where an angular rotation rate is to be measured. A vibratory MEMS gyroscope typically includes a mass that is movable along a drive axis in resonant oscillation by the use of a drive force to provoke and maintain the movement. In the presence of angular rotation, a Coriolis force will be applied to the movable mass. The Coriolis force is proportional to the velocity of the movable mass, its angular rate of rotation, and its mass. The Coriolis force is perpendicular to the direction of movement, which results in a displacement of the movable mass along a sense axis perpendicular to the drive axis. Measurement of the displacement of the movable mass along the sense axis can be used to obtain a measure of the Coriolis force and thus a measure of the angular rate of rotation about an input axis that is perpendicular to both the sense and the drive axes.

Determination of the angular rotation rate requires consistent and accurate oscillator motion of the movable mass along the drive axis. Thus, the vibratory gyroscope includes oscillator drive circuitry to measure and control the displacement and amplitude of the sinusoidal movement of the mechanical resonator (e.g., the movable mass). To ensure accuracy, a device under test (DUT), such as a vibratory MEMS gyroscope, typically undergoes final test procedures that include, among other processes, trim (also referred to herein as calibration) a phase lag between an oscillating drive signal imparted on a drive resonator (e.g., a movable mass) and a measurement signal indicative of the oscillation of the drive resonator. For example, analog signals of the drive loop are routed through test busses to a tester, the tester measures the phase lag, and the tester adjusts trim code for a phase shift circuit of the oscillator drive circuitry. Routing analog signals outside the DUT into a noisy final test environment can be a source of error and needs time to stabilize. Accordingly, such a test procedure is typically iterative, time consuming, and therefore costly.

SUMMARY

Aspects of the disclosure are defined in the accompanying claims.

In a first aspect, there is provided a trim circuit for a sensor, the sensor including an oscillator drive circuit configured to provide an oscillating drive signal at a resonant frequency to drive a movable mass of the sensor, the oscillator drive circuit including a phase shift circuit having an input configured to receive a first signal indicative of an oscillation of the movable mass and having an output, the phase shift circuit being configured to add a phase shift component to the first signal and produce a second signal shifted in phase by the phase shift component, wherein the trim circuit comprises: a first comparator connected with the input of the phase shift circuit and configured to receive the first signal; a second comparator in communication with the output of the phase shift circuit and configured to receive the second signal; and a processing element in communication with the first and second comparators, the processing element being configured to determine a phase lag between the first and second signals and produce a trim code in response to the phase lag for use by the phase shift circuit, the trim code being configured to adjust the phase shift component.

In a second aspect, there is provided a method for phase trimming an oscillator drive circuit in a sensor, the oscillator drive circuit being configured to provide an oscillating drive signal at a resonant frequency to drive a movable mass of the sensor, the oscillator drive circuit including a phase shift circuit having an input configured to receive a first signal indicative of an oscillation of the movable mass and having an output, the phase shift circuit being configured to add a phase shift component to the first signal and produce a second signal shifted in phase by the phase shift component, the method comprising: receiving the first signal at a first comparator connected with the input of the phase shift circuit; receiving the second signal at a second comparator in communication with the output of the phase shift circuit; determining, at a processing element, a phase lag between the first and second signals; and producing, at the processing element, a trim code in response to the phase lag for use by the phase shift circuit, the trim code being configured to adjust the phase shift component.

In embodiments, the method further comprises: providing a digital clock signal having a clock frequency that is greater than the resonant frequency; determining, at the processing element, a first quantity of clock pulses of the digital clock signal during one period of the first signal; defining a target phase lag in response to the first quantity of clock pulses; determining, at the processing element, a second quantity of the clock pulses of the digital clock signal between a first edge of the first signal and a second edge of the second signal; determining the phase lag from the second quantity of clock pulses; and producing the trim code that minimizes a difference between the phase lag and the target phase lag.

In a third aspect, there is provided a device comprising: a movable mass; an oscillator drive circuit configured to provide an oscillating drive signal at a resonant frequency to drive the movable mass, the oscillator drive circuit including a phase shift circuit having an input configured to receive a first signal indicative of an oscillation of the movable mass and having an output, the phase shift circuit being configured to add a phase shift component to the first signal and produce a second signal shifted in phase by the phase shift component; and a trim circuit comprising: a first comparator connected with the input of the phase shift circuit and configured to receive the first signal; a second comparator in communication with the output of the phase shift circuit and configured to receive the second signal; and a processing element in communication with the first and second comparators, the processing element being configured to determine a phase lag between the first and second signals and produce a trim code in response to the phase lag for use by the phase shift circuit, wherein the oscillator drive circuit and the trim circuit are implemented inside an integrated circuit of the device.

In embodiments, the second comparator is only enabled during a trim process to produce the trim code.

In embodiments, the trim code is configured to be implemented at the phase shift circuit to adjust the phase shift component to produce a target phase lag between the first and second signals.

In embodiments, the device further comprises an oscillator for producing a digital clock signal having a clock frequency that is greater than the resonant frequency, wherein the processing element is configured to: determine a first quantity of clock pulses of the digital clock signal during a period of the first signal; define a target phase lag in response to the first quantity of clock pulses: determine a second quantity of clock pulses of the digital clock signal between a first edge of the first signal and a second edge of the second signal; determine the phase lag from the second quantity of clock pulses; and produce the trim code that minimizes a difference between the phase lag and the target phase lag.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a vibratory gyroscope device and a trim circuit for phase calibration of an oscillator drive circuit of a vibratory gyroscope device. The trim circuit and the oscillator drive circuit are implemented inside an integrated circuit of the vibratory gyroscope device, and the algorithm for trimming, or calibrating, the oscillator drive circuit is embedded in the integrated circuit. Thus, phase calibration of the oscillator circuit can be performed inside the integrated circuit, instead of by an external tester. Accordingly, reductions in final test time and test costs may be achieved. Furthermore, no delay or other potential errors are introduced by the final test equipment or the test environment as the signals are kept inside the device under test (DUT). Thus, the precision of the phase calibration may be improved relative to calibration using external testers. Still further, since phase calibration is performed inside the integrated circuit, phase calibration may be performed once or periodically by a user in a final application.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

Figure 1:
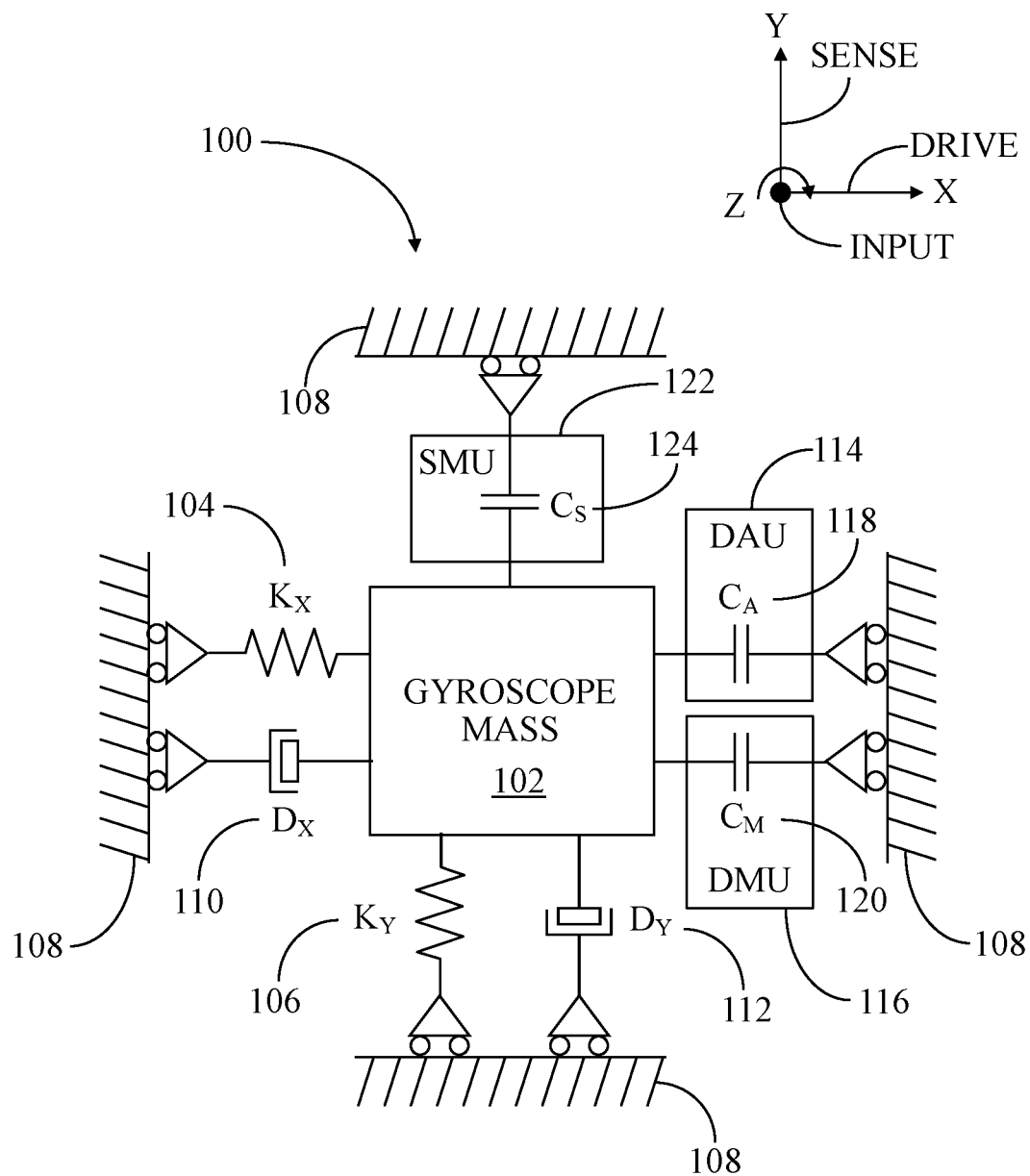
FIG. 1 shows a functional schematic diagram of a vibratory microelectromechanical systems (MEMS) gyroscope.

Referring to FIG. 1, FIG. 1 shows a functional schematic diagram of a vibratory microelectromechanical systems (MEMS) gyroscope 100. Vibratory gyroscope 100 has a mechanical resonator, referred to herein as a gyroscope mass 102 or a movable mass 102, that is connected by springs 104, 106 (indicated with respective spring coefficients $K_X$, $K_Y$) to a substrate 108. FIG. 1 further schematically shows pistons 110, 112 (indicated with damping coefficients $D_X$, $D_Y$) representing modeling of damping behavior of springs 104, 106 and friction, such as air friction, of movement of gyroscope mass 102. In this schematic representation, gyroscope mass 102 is movable along a drive axis X using a drive force. The drive force is supplied and controlled using a drive actuation unit 114 (DAU) and a drive measurement unit 116 (DMU) and associated circuitry (exemplary circuitry is shown and described below). Drive actuation unit 114 includes at least one drive capacitor 118, $C_A$, having a drive capacitor terminal connected to substrate 108 and an opposite drive capacitor terminal connected to the movable gyroscope mass 102. The opposite drive capacitor terminal may be formed by a part of the movable mass 102. Drive capacitor 118 of drive actuation unit 114 is oriented such that a capacitive force between the drive capacitor terminals is oriented along the drive axis X for providing the drive force to displace gyroscope mass 102.

Drive measurement unit 116 includes at least one measurement capacitor 120, $C_M$, having a measurement capacitor terminal connected to substrate 108 and an opposite measurement capacitor terminal connected to the movable mass 102. Measurement capacitor 120 is oriented such that a capacitive force between the measurement capacitor terminal and the opposite measurement capacitor terminal is oriented along the drive axis X. A measure of the capacitor force between the measurement capacitor terminals may thus provide a measure of the displacement of gyroscope mass 102 along the drive axis.

A sense measurement unit 122 (SMU) includes a sense capacitor 124, $C_S$, having a sense capacitor terminal connected to substrate 108 and an opposite sense capacitor terminal connected to movable mass 102. The opposite sense capacitor terminal may be formed by a part of movable mass 102. Sense capacitor 124 of sense measurement unit 122 is oriented such that a capacitor force between the sense capacitor terminals is oriented along a sense axis Y, the sense axis Y being perpendicular to the drive axis X.

Figure 2:
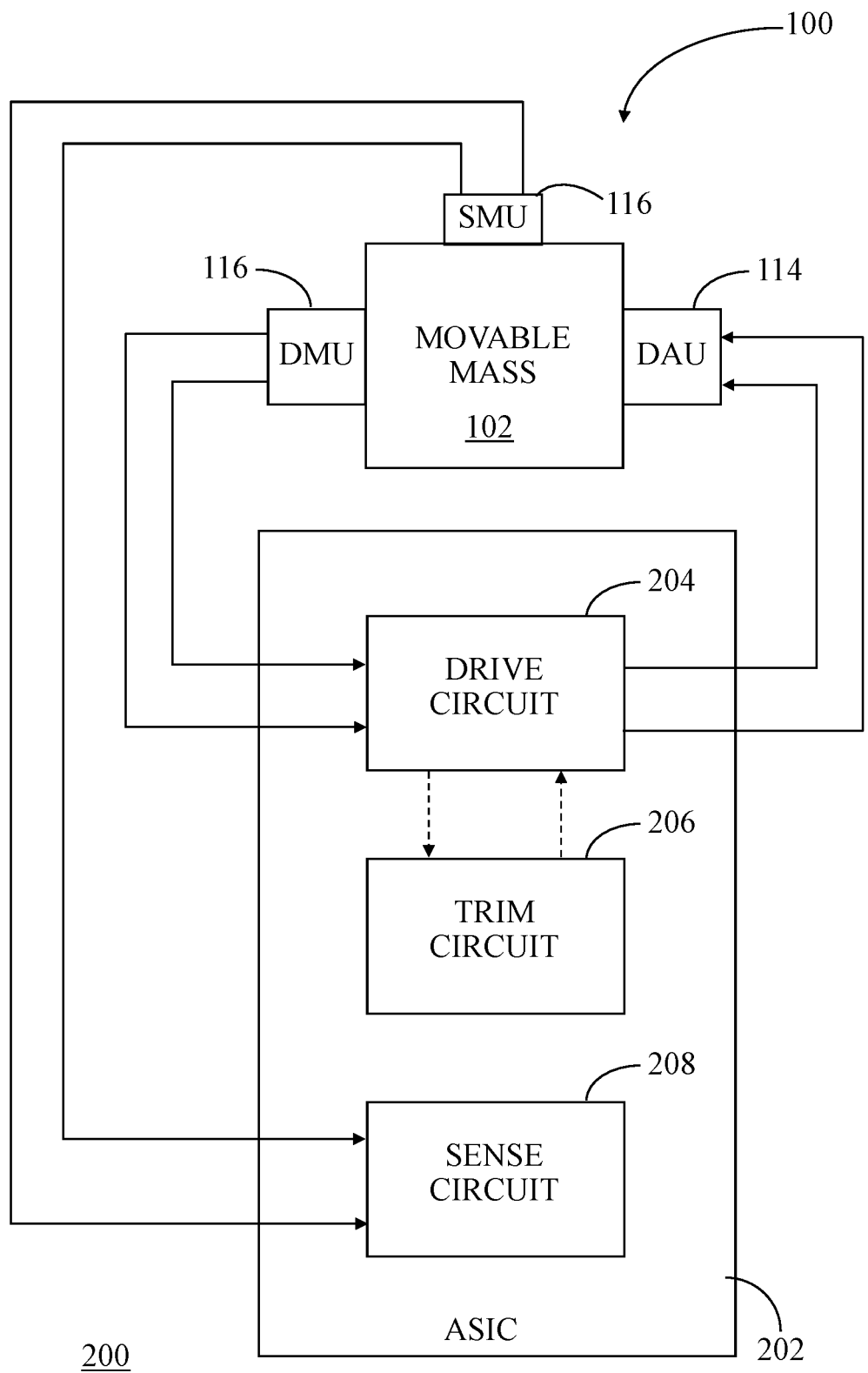
FIG. 2 shows a block diagram of a device in accordance with an embodiment.

FIG. 2 shows a block diagram of a device 200 in accordance with an embodiment. Device 200 includes vibratory gyroscope 100 and circuitry implemented in an application specific integrated circuit 202 (ASIC) for use with gyroscope 100. The circuitry generally includes an oscillator drive circuit 204, a trim circuit 206, and a sense circuit 208. Drive circuit 204 is shown connected to drive actuation unit 114 (DAU) and drive measurement unit 116 (DMU) and sense circuit 208 is shown connected to sense measurement unit 122. However, drive circuit 204 and sense circuit 208 may also be implemented with other types of sensors than the one shown in FIG. 1. Device 200 may be a sensor package that includes gyroscope 100 along with ASIC 202, or device 200 may be embedded within a larger system that includes the sensor package and one or more other sensors, processors, and so forth in and end use application.

As will be discussed in greater detail below, oscillator drive circuit 204 is configured to provide an oscillating output signal at a resonant frequency to drive a mechanical resonator (e.g., movable gyroscope mass 102) of a sensor (e.g., vibratory gyroscope 100). In accordance with an embodiment, trim circuit 206 may be enabled to trim or calibrate a phase shift circuit (discussed below) of oscillator drive circuit 204 in lieu of calibration by an external tester. As such, trim circuit 206 is shown connected to drive circuit 204 via dashed lines to denote that trim circuit 206 may be enabled once, occasionally, or periodically in accordance with an intended trim process.

Figure 3:
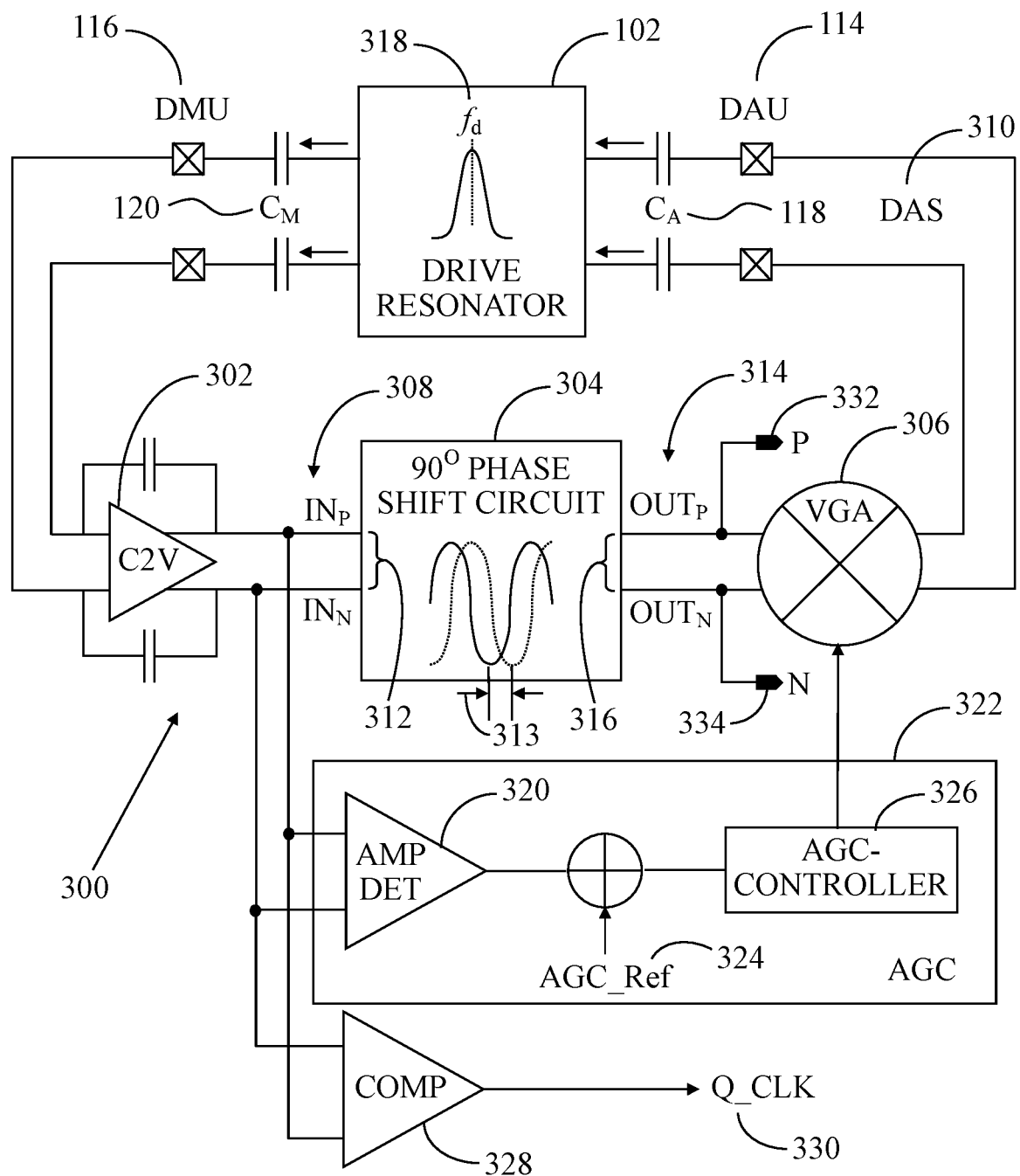
FIG. 3 shows a block diagram of an oscillator drive circuit of the device of FIG. 2.

FIG. 3 shows a block diagram of oscillator drive circuit 204 of device 200 (FIG. 2). Oscillator drive circuit 204 controls the displacement-amplitude of the moving mass (e.g., gyroscope mass 102) in the mechanical resonator (e.g., gyroscope 100). As such, an oscillator drive loop 300 of oscillatory drive circuit 204 includes a capacitance-to-voltage (C2V) amplifier 302, a phase shift circuit 304, a variable gain amplifier (VGA) 306, and the mechanical drive resonator. For purposes of explanation, movable gyroscope mass 102, along with spring 104 and piston 110 (FIG. 1), may be the mechanical drive resonator in this configuration and the resonant frequency of the mechanical drive resonator is the square root of the spring constant, $K_X$, divided by the mass of movable gyroscope mass 102.

Drive measurement unit 116 is arranged to provide a measure of the capacitance (e.g., a time variable current or charge) between the capacitor terminals of measurement capacitor 120. C2V amplifier 302 is connected to drive measurement unit 116 and is configured to produce a drive measurement voltage signal 308 ($IN_P$ and $IN_N$) indicative of a displacement of movable gyroscope mass 102 along a drive axis X of vibratory gyroscope 100. That is, the capacitive variations (proportional to displacement) are converted into drive measurement voltage signal 308 by C2V amplifier 302.

Phase shift circuit 304 has an input 312 configured to receive a first signal (e.g., drive measurement voltage signal 308) indicative of an oscillation of movable gyroscope mass 102. Phase shift circuit 304 is configured to add a phase shift component 313 to drive measurement signal 308 and produce a second signal (e.g. a phase shifted drive measurement voltage signal 314 ($OUT_P$ and $OUT_N$)) at an output 316 of phase shift circuit 304, where phase shifted drive measurement voltage signal 314 is shifted in phase by phase shift component 313. In some configurations, phase shift circuit 304 is arranged to shift the phase of drive measurement signal 308 by 90 degrees to compensate for a phase lag of movable mass 102 between drive signal 310 and drive measurement signal 308. Thus, phase shift circuit 304 may alternatively be referred to herein as 90° phase shift circuit 304. Accordingly, phase shift circuit 304 following C2V amplifier 302 is arranged to yield a 90 degree phase shift in the resonator (e.g., movable mass 102) at a drive resonant frequency 318 ($f_d$) and an inversion in drive loop 300 adds a 180 degree phase shift for a total of 360 degrees necessary for oscillation of movable gyroscope mass 102.

Variable gain amplifier 306 is connected to drive capacitor 118 of drive actuation unit 114 to provide an oscillating voltage drive signal 310 (DAS) to drive capacitor 118. Voltage drive signal 310 results in a capacitive (electrostatic) force between the capacitor terminals of drive capacitor 118, oriented along the drive axis to thereby invoke and maintain oscillating motion of gyroscope mass 102 along the drive axis X.

An amplitude detector 320 of an automatic gain control (AGC) circuit 322 receives drive measurement voltage signal 308. Automatic gain control circuit 322 compares drive measurement voltage signal 308 with a reference value 324 (AGC_Ref), and an AGC-controller 326 adjusts the gain of variable gain amplifier 306 until drive measurement voltage signal 308 is equal to reference value 324. Thus, automatic gain control circuit 322 regulates target displacement-amplitude of movable mass 102.

A first comparator 328 is connected to an output of C2V amplifier 302, and is therefore connected to input 312 of phase shift circuit 304. First comparator 328 receives drive measurement voltage signal 308 and generates a first clock signal 330, Q_CLK, which is equal to resonant frequency 318, $f_d$. Clock signal 330 is important within a vibrating gyroscope (e.g. vibratory gyroscope 100) in terms of timing. In particular, all clocks of the system are synchronized to clock signal 330 produced by first comparator 326. Accordingly, clock signal 330 is the reference clock for device 200 (FIG. 2)

In some configurations, 90° phase shift circuit 304 may be realized by a passive resistor-capacitor (RC) network. In other configurations, 90° phase shift circuit 304 may be realized by an active integrator/differentiator circuit. Integrator/differential circuits also utilize resistors and capacitors to set phase lead/lag behavior. Integrated circuit passive components are not very stable over process variations and their values can vary by +/−20% in production. Variations in resistor and capacitor values do not correlate in semiconductor processes, which can increase the spread of RC product in phase shift circuit 304. Further, one of the conditions that needs to be satisfied for an oscillator drive, such as drive loop 300, is the phase around the loop. This phase must be 0 degrees or a multiple of 360 degrees. Due to variation of resistor and capacitor values, a target phase lag (e.g., 90 degrees) is not guaranteed by processes, thus the phase must be trimmed (alternatively referred to herein as calibrated).

In accordance with an embodiment, phase trim is performed utilizing trim circuit 206 (FIG. 2) implemented inside ASIC 202 of the vibratory gyroscope device (device 200). Such an approach may achieve reductions in final test time and test costs and/or reduce delay or potential errors associated with final test equipment or the test environment since the signals are kept inside the device under test (DUT) to enhance the precision of the phase calibration relative to the use of external testers. Still further, since phase calibration is performed inside ASIC 202, phase calibration may be performed once or periodically by a user in a final application. Accordingly, in the illustrated embodiment, drive circuit 204 includes interconnections 332, 334 for electrically connecting drive circuit 204 to trim circuit 206 to provide phase shifted drive measurement voltage signal 314 to trim circuit 206.

Figure 4:
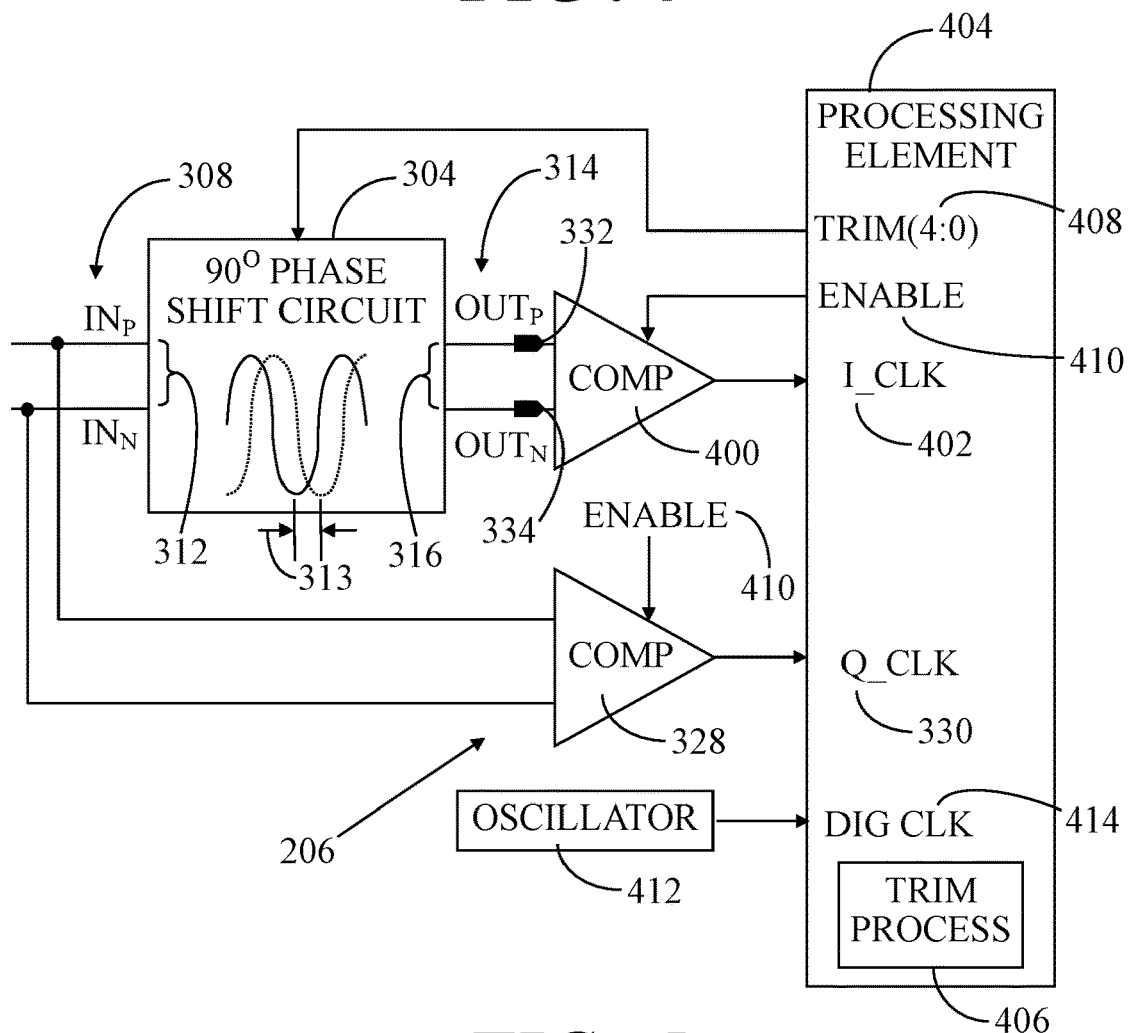
FIG. 4 shows a block diagram of a trim circuit of the device of FIG. 2.

Referring now to FIG. 4, FIG. 4 shows a block diagram of trim circuit 206 of device 200 (FIG. 2) for trimming phase shift circuit 304. Trim circuit 206 includes a first comparator (e.g., first comparator 328) connected with an output of C2V amplifier 302 and therefore connected with input 312 of phase shift circuit 304 is this configuration. As described earlier, first comparator 328 is configured to receive the first signal (e.g., drive measurement voltage signal 308) output by C2V amplifier 302.

Trim circuit 206 further includes a second comparator 400 in communication with output 316 of phase shift circuit 304. Second comparator 400 is configured to receive the second signal (e.g., phase shifted drive measurement voltage signal 314). In this configuration, second comparator 400 is electrically connected to output 316 of phase shift circuit 304 via interconnections 332, 334. It should be understood, however, that second comparator 400 may be electrically connected anywhere between output 316 up to and including input pins to drive actuation unit 114 (FIG. 1) for receiving phase shifted drive measurement voltage signal 314. Second comparator 400 outputs a second clock signal 402, I_CLK, at resonant frequency 318 (FIG. 3) in response to phase shifted measurement drive voltage signal 314.

Trim circuit 206 additionally includes a processing element 404 in communication with first and second comparators 328, 400. As will be discussed in greater detail below, processing element 404 is configured to execute a trim process algorithm 406 to determine an actual phase lag between the first and second signals (e.g., drive measurement voltage signal 308 and phase shifted drive measurement voltage signal 314) and produce a trim code 408 in response to the determined phase lag for use by phase shift circuit 304. More particularly, processing element 404 receives first and second clock signals 330, 402 and utilizes them to produce trim code 408. Trim code 408 is configured to adjust phase shift component 313 to yield a 90 degree phase shift between the first and second signals (e.g., drive measurement voltage signal 308 and phase shifted drive measurement voltage signal 314). In some embodiments, second comparator 400 is only enabled during execution of trim process algorithm 406 to produce trim code 408. Hence, second comparator 400 may receive an enable signal 410 from processing element 404 at the onset of execution of trim process algorithm 406. Comparator 328 may be continually enabled since it is needed to provide clock signal 330 (FIG. 3) for the rest of the system.

In some embodiments, trim circuit 206 further includes an oscillator 412 for providing a digital clock signal 414 having a clock frequency that is greater than drive resonant frequency 318 (FIG. 3). By way of example, drive resonant frequency 318 may be approximately 20 kHz, which may be significantly less than a multiple-MHz frequency for processing element 404. Digital clock signal 414 may be provided by oscillator 412. Alternatively, a phase lock loop circuit (not shown) may be implemented as oscillator 412, and digital clock signal 414 may be provided at the output of the phase lock loop circuit with first clock signal 330 as a reference. In general, digital clock signal 414 is utilized along with first and second clock signals 330, 402 to produce trim code 408.

Figure 5:
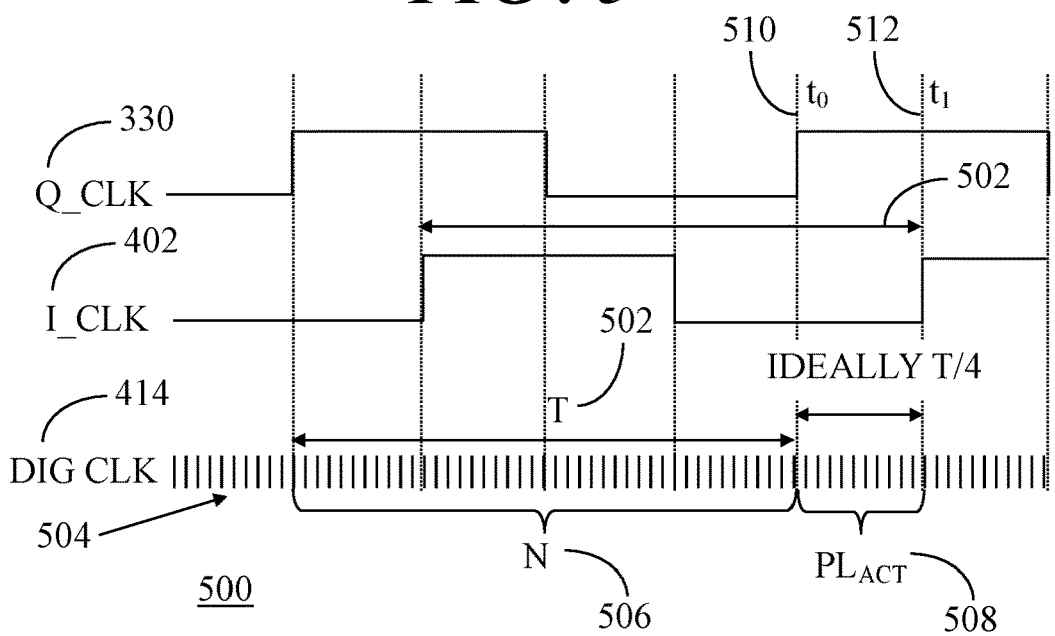
FIG. 5 shows a timing diagram of signals that may be used to calibrate a phase shift circuit of the oscillator drive circuit.

Referring to FIG. 5 in connection with FIG. 4, FIG. 5 shows a timing diagram 500 of signals that may be used to calibrate phase shift circuit 304 of oscillator drive circuit 204. In the illustrated example, timing diagram 500 shows one period 502 (T) of first clock signal 330, one period 502 of second clock signal 402, and a multiplicity of clock pulses 504 of digital clock signal 414. During execution of trim process algorithm 406, processing element 404 counts a first quantity or number 506 (N) of high-frequency clock pulses 504 during one period 502 of first clock signal 330. Processing element 404 additionally counts a second quantity 508 of clock pulses 504 between a first rising edge 510 of first clock signal 330 and a second rising edge 512 of second clock signal 440. Thus, second quantity 508 corresponds to a phase lag between first and second clock signals 330, 402 and, hence between first and second signals 308, 314.

In order to achieve a target 90 degree phase lag (e.g., one quarter of period 502, T/4) between first and second clock signals 330, 402 (and correspondingly first and second signals 308, 314), second quantity 508 of clock pulses 504 between first and second rising edges 510, 512 should ideally be one quarter of first quantity 506 (e.g., N/4) of clock pulses 504 during one period 502. When second quantity 508 is not equivalent to one quarter of first quantity 506 of clock pulses 504, trim code 408 can be generated by processing element 404 and provided to phase shift circuit 304 to adjust phase shift component 313 to yield a 90 degree phase shift between first and second signals 308, 314.

As mentioned previously, phase shift circuit 304 may be based on absolute resistor and capacitor values. The absolute resistor value may be realized by connecting multiple unit resistors in series. Trim code 408 may change the resistor value by effectively adding or removing resistors from phase shift circuit 304 through switches. Alternatively, the absolute capacitor value may be realized by connecting multiple unit capacitors in parallel. As such, trim code 408 may change the capacitor value by effectively adding or removing capacitors from phase shift circuit 304 through switches. Still further, trim code 408 may change both resistor and capacitor values in phase shift circuit 304 through suitable switching.

Figure 6:
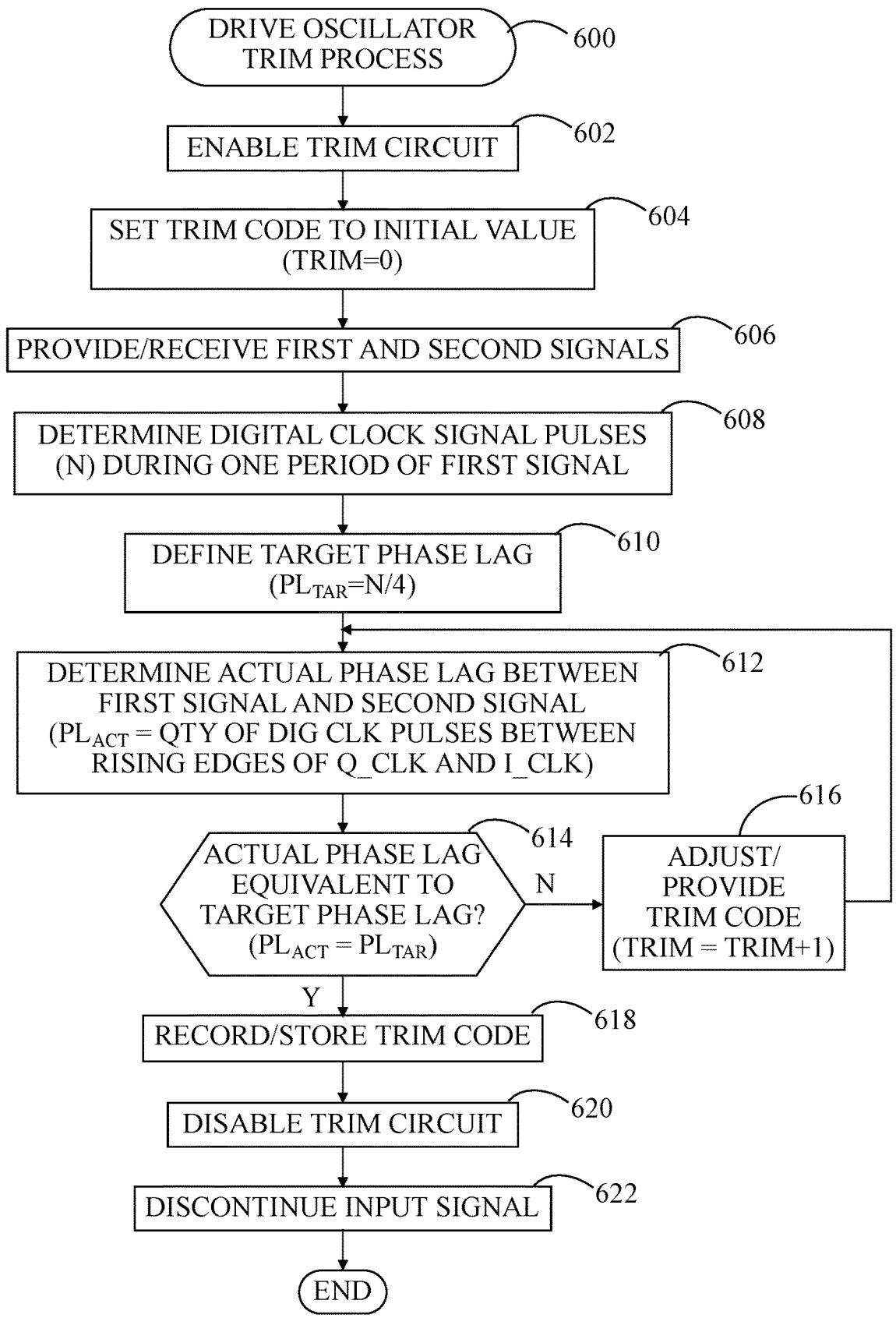
FIG. 6 shows a flowchart of a drive oscillator trim process performed at the device of FIG. 2.

FIG. 6 shows a flowchart of a drive oscillator trim process 600 performed at device 200 (FIG. 2) through execution of trim process algorithm 406 (FIG. 4) at processing element 404 (FIG. 4). Drive oscillator trim process 600 may be performed during final test of a vibratory gyroscope device, in an end use application, or periodically when device 200 is placed in an operational environment. FIGS. 3-5 may be viewed concurrently with drive oscillator trim process 600 of FIG. 6.

At a block 602, trim circuit 206 is enabled. By way of example, processing element 404 may provide enable signal 410 to second comparator 400. Of course, first comparator 328 is likely always enabled since it provides clock signal 330 to the entire system. At a block 604, the trim code (e.g., trim code 408) is set to an initial value. For example, the trim code may be set to zero (TRIM=0). By design, setting a trim code to zero may yield a phase lag between first and second signals 308, 314 that is smaller than 90 degrees.

At a block 606, first signal 308 is provided. In an example, drive circuit 204 (FIG. 2) may be tested in an open loop configuration. Thus, the first signal 308 may be an externally provided test signal (e.g., provided by an external tester or stored within ASIC 202) at resonant frequency 318. Alternatively, first signal 308 may be output from C2V amplifier 302 and may correspond to an induced oscillation of movable mass 102 (FIG. 1). In either instance, phase shift circuit 304 is configured to add phase shift component 313 to first signal 308 to produce second signal 314 that is shifted in phase by phase shift component 313. As a consequence of providing first signal 308, first signal 308 is received at first comparator 328 and second signal 314 is received at second comparator 400 in connection with operational block 606.

At a block 608, the high-frequency clock pulses 504 of digital clock signal 414 are counted or otherwise determined by processing element 404 during one period 502 of first signal 308. By way of example, through its connection to the outputs of first and second comparators 328, 400, processing element 404 receives first and second clock signals 330, 402 and can ascertain period 502 of first and second signals 308, 314. Additionally, through its connection to oscillator 412, processing element 404 receives digital clock signal 414 and can thereafter determine first quantity 506 of clock pulses 504 during one period 502.

At a block 610, a target phase lag ($PL_{TAR}$) is defined from clock pulses 504. For example, a target phase lag, $PL_{TAR}$=N/4, will ideally yield a 90 degree phase lag. At a block 612, an actual phase lag, $PL_{ACT}$, is determined between first and second signals 308, 314. As described in connection with FIG. 5, the actual phase lag (e.g., the delay) between first and second signals 308, 314 may be quantity 508 of the high-frequency clock pulses 504 of digital clock signal 414 between first and second rising edges 510, 512 of clock periods 502 of first and second signals 308, 314.

At a query block 614, a determination is made as to whether the actual phase lag is equivalent to the target phase lag (e.g., $PL_{ACT}$=$PL_{TAR}$). When a determination is made that the actual phase lag is not equivalent to the target phase lag, trim code 408 is adjusted at a block 616. For example, the trim code may be incremented by one (TRIM=TRIM+1). This adjusted trim code can then be provided to phase shift circuit 304. Thereafter, program control loops back to block 612 to again determine the actual phase lag in response to the adjusted trim code and compare the actual phase lag between first and second signals 308, 310 to the target phase lag at query block 614. When a determination is made at query block 614 that the actual phase lag is equivalent to the target phase lag (e.g., $PL_{ACT}$=$PL_{TAR}$), process control continues at a block 618. Thus, the iterative execution of process blocks 612, 614, 616 produces trim code 408 that minimizes a difference between the actual phase lag and a target phase lag.

At block 618, the trim code is recorded or otherwise stored. For example, trim code 408 may be provided to phase shift circuit 304 to change resistor and/or capacitor values to achieve the target phase shift (e.g., 90 degrees). At a block 620, trim circuit 206, and particularly, second comparator 400, is disabled, and at a block 622, first signal 308 (e.g., a test signal) may be discontinued. Thereafter, drive oscillator trim process 600 ends.

Trim process 600 is described in connection with measuring over a single period of first and second signals 308, 314. However, calibration precision may be increased by measuring over multiple periods of first and second signals 308, 314. In another embodiment, the number (e.g., first quantity 506) of high-frequency clock pulses during a period may be written into a register and the quantity (e.g., second quantity 508) of high-frequency clock pulses in a phase lag may written into another register. Final test equipment may be configured to read the registers and adjust and provide trim code 408. Such an approach may be less convenient than performing the entire trim process on-board ASIC 202. Nevertheless, such an approach still avoids the capture of analog signals through test busses into a noisy final test environment, as discussed above in connection with prior art approaches. In still another embodiment, second comparator 400 may be suitably connected to monitor drive actuation unit 114 (FIG. 2) that is driving movable mass 102. Thus, imperfections of circuits following phase shift circuit 304 may also be compensated for by trim process 600. And still further, a continuous algorithm may be enabled (e.g., continuous execution of drive oscillator trim process 600) which may be able to compensate for temperature in real time. For example, if $PL_{ACT}$ is greater than $PL_{TAR}$ plus a threshold, the trim code could be incremented, if $PL_{ACT}$ is less than $PL_{TAR}$ minus the threshold, the trim code could be decremented, and if the absolute value of the difference between $PL_{ACT}$ and $PL_{TAR}$ is less then or equal to the threshold, the trim code would remain unchanged.

Consequently, execution of trim process 600 enables self-calibration of the phase of, for example, a vibratory MEMS gyroscope by using two comparators, one at the input of a phase shift circuit, and the other at the output of the phase shift circuit. A phase lag, or delay, between the clock signals of the comparators is compared with a target phase lag, and trim code can be adjust to provide the target phase lag (e.g., 90 degree phase lag). It should be understood that certain ones of the process blocks depicted in FIG. 6 may be performed in parallel with each other or with performing other processes. In addition, the particular ordering of the process blocks depicted in FIG. 6 may be modified while achieving substantially the same result. Accordingly, such modifications are intended to be included within the scope of the inventive subject matter.

Embodiments described herein entail a vibratory gyroscope device and a trim circuit for phase calibration of an oscillator drive circuit of a vibratory gyroscope device. The trim circuit and the oscillator drive circuit are implemented inside an integrated circuit of the vibratory gyroscope device, and the algorithm for trimming, or calibrating, the oscillator drive circuit is embedded in the integrated circuit. Thus, phase calibration of the oscillator circuit can be performed inside the integrated circuit, instead of by an external tester. Accordingly, reductions in final test time and test costs may be achieved. Furthermore, no delay or other potential errors are introduced by the final test equipment or the test environment as the signals are kept inside the device under test (DUT). Thus, the precision of the phase calibration may be improved relative to calibration using external testers. Still further, since phase calibration is performed inside the integrated circuit, phase calibration may be performed once or periodically by a user in a final application.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The invention claimed is:

1. A trim circuit for a sensor, the sensor including an oscillator drive circuit configured to provide an oscillating drive signal at a resonant frequency to drive a movable mass of the sensor, the oscillator drive circuit including a phase shift circuit having an input configured to receive a first signal indicative of an oscillation of the movable mass and having an output, the phase shift circuit being configured to add a phase shift component to the first signal and produce a second signal shifted in phase by the phase shift component, wherein the trim circuit comprises:
   a first comparator connected with the input of the phase shift circuit and configured to receive the first signal;
   a second comparator in communication with the output of the phase shift circuit and configured to receive the second signal; and
   a processing element in communication with the first and second comparators, the processing element being configured to determine a phase lag between the first and second signals and produce a trim code in response to the phase lag for use by the phase shift circuit, the trim code being configured to adjust the phase shift component, wherein the trim code is configured to minimize a difference between the phase lag and a target phase lag.

2. The trim circuit of claim 1 wherein the oscillator drive circuit and the trim circuit are implemented inside an integrated circuit of the sensor.

3. The trim circuit of claim 1 wherein the second comparator is only enabled during a trim process to produce the trim code.

4. The trim circuit of claim 1 wherein the first signal is an externally provided test signal at the resonant frequency.

5. The trim circuit of claim 1 wherein the oscillator drive circuit further includes a capacitance-to-voltage amplifier configured to receive a time variable charge indicative of an induced oscillation of the movable mass and convert the time variable charge to the first signal, the first signal corresponding to the induced oscillation of the movable mass.

6. The trim circuit of claim 1 wherein the trim code is configured to be implemented at the phase shift circuit to adjust the phase shift component to produce a target phase lag between the first and second signals.

7. The trim circuit of claim 6 wherein the phase shift circuit comprises a 90° phase shifter, the target phase shift component is a 90° phase adjustment of the first signal to produce the second signal.

8. The trim circuit of claim 1 further comprising an oscillator for providing a digital clock signal having a clock frequency that is greater than the resonant frequency, wherein the processing element is configured to:
   determine a first quantity of clock pulses of the digital clock signal during a period of the first signal;
   define a target phase shift component in response to the first quantity of clock pulses:
   determine a second quantity of clock pulses of the digital clock signal between a first edge of the first signal and a second edge of the second signal;
   define a target phase shift component in response to the first quantity of clock pulses;
   determine a second quantity of clock pulses of the digital clock signal between a first edge of the first signal and a second edge of the second signal; and
   determine the phase lag from the second quantity of clock pulses.

9. A device comprising:
   a movable mass;
   an oscillator drive circuit configured to provide an oscillating drive signal at a resonant frequency to drive the movable mass, the oscillator drive circuit including a phase shift circuit having an input configured to receive a first signal indicative of an oscillation of the movable mass and having an output, the phase shift circuit being configured to add a phase shift component to the first signal and produce a second signal shifted in phase by the phase shift component; and
   a trim circuit comprising:
   a first comparator connected with the input of the phase shift circuit and configured to receive the first signal;
   a second comparator in communication with the output of the phase shift circuit and configured to receive the second signal; and
   a processing element in communication with the first and second comparators, the processing element being configured to determine a phase lag between the first and second signals and produce a trim code in response to the phase lag for use by the phase shift circuit, wherein the oscillator drive circuit and the trim circuit are implemented inside an integrated circuit of the device, wherein the trim code is configured to minimize a difference between the phase lag and a target phase lag.

10. The device of claim 9 wherein the second comparator is only enabled during a trim process to produce the trim code.

11. The device of claim 9 wherein the trim code is configured to be implemented at the phase shift circuit to adjust the phase shift component to produce a target phase lag between the first and second signals.

12. A device comprising:
   a movable mass;
   an oscillator drive circuit configured to provide an oscillating drive signal at a resonant frequency to drive the movable mass, the oscillator drive circuit including a phase shift circuit having an input configured to receive a first signal indicative of an oscillation of the movable mass and having an output, the phase shift circuit being configured to add a phase shift component to the first signal and produce a second signal shifted in phase by the phase shift component;
   a trim circuit comprising:
   a first comparator connected with the input of the phase shift circuit and configured to receive the first signal;
   a second comparator in communication with the output of the phase shift circuit and configured to receive the second signal; and
   a processing element in communication with the first and second comparators, the processing element being configured to determine a phase lag between the first and second signals and produce a trim code in response to the phase lag for use by the phase shift circuit, wherein the oscillator drive circuit and the trim circuit are implemented inside an integrated circuit of the device; and
   an oscillator for producing a digital clock signal having a clock frequency that is greater than the resonant frequency, wherein the processing element is configured to:
   determine a first quantity of clock pulses of the digital clock signal during a period of the first signal;

define a target phase lag in response to the first quantity of clock pulses:

determine a second quantity of clock pulses of the digital clock signal between a first edge of the first signal and a second edge of the second signal;

determine the phase lag from the second quantity of clock pulses; and produce the trim code that minimizes a difference between the phase lag and the target phase lag.

13. The trim circuit of claim 12 wherein the second comparator is only enabled during a trim process to produce the trim code.

14. The device of claim 12 wherein the trim code is configured to be implemented at the phase shift circuit to adjust the phase shift component to produce a target phase lag between the first and second signals.

* * * * *